(12) United States Patent
Pitts

(10) Patent No.: US 6,747,481 B1
(45) Date of Patent: Jun. 8, 2004

(54) ADAPTIVE ALGORITHM FOR ELECTRICAL FUSE PROGRAMMING

(75) Inventor: Robert L. Pitts, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/301,986

(22) Filed: Nov. 22, 2002

(51) Int. Cl.[7] .................................. H03K 19/177
(52) U.S. Cl. ....................... 326/41; 326/38; 327/525
(58) Field of Search ................. 326/37–41; 327/525

(56) References Cited

U.S. PATENT DOCUMENTS 5,367,207 A * 11/1994 Goetting et al. .............. 326/38
5,544,070 A * 8/1996 Cox et al. ..................... 716/17
6,188,242 B1 * 2/2001 Mahajan et al. ............. 326/41
6,339,559 B1 * 1/2002 Bertin et al. ............. 365/225.7

* cited by examiner

*Primary Examiner*—Don Le
(74) *Attorney, Agent, or Firm*—Robert D. Marshall, Jr.; W. James Brady, III; Frederick J. Telecky, Jr.

(57) ABSTRACT

This invention describes a means for preventing eFuses from growing back under successive programming pulses after being successfully fused by an earlier set of programming pulses. The solution is achieved through the use of an adaptive programming algorithm for blowing the eFuses. In the adaptive algorithm once a high enough resistance on a blown eFuse has been attained it will not receive additional programming pulses that could cause it to become measurably lower resistance.

4 Claims, 2 Drawing Sheets

ADAPTIVE ALGORITHM FOR ELECTRICAL FUSE PROGRAMMING

TECHNICAL FIELD OF THE INVENTION

The technical field of this invention is integrated circuit programming by selective activation of electrical fuses.

BACKGROUND OF THE INVENTION

Programmable devices have made a great impact on integrated circuit devices. The possibility of programming a device to do a specific task efficiently has made modest cost 'special purpose processors' a reality. Programmable devices are available from a wide variety manufacturers having mass production capability for the parent device. Programmation most often depends on a reliable methodology for 'customizing' a device in a repeatable, non-complex manner. 'Fusing' of the connections within the programmable logic is the most common process of programmation. Many fusible interconnect links are constructed of materials such as doped polysilicon.

These electrical fuses (eFuses) in VLSI silicon devices have been programmed conventionally by applying a large amount of power to the fuse body to melt and separate the fuse body material. This changes the fuse resistance from a low pre-blow resistance to a high post-blow resistance. This result can be sensed to determine the state of the eFuse: unblown or blown. As process technology has progressed to smaller and smaller geometry the maximum operating voltages have also scaled downward, making it more difficult to get massive power to the eFuses. Also, it is always desirable to minimize the amount of current the programming operation requires so that metallization power buses that deliver the current to the eFuses do not have to be large.

One of the common difficulties encountered in programming eFuses in sub-nanometer technologies for example, where there are significant voltage limitations, is that of providing enough power to reliably blow the fuse in a single programming pulse. It has been shown that multiple programming pulses may be employed to achieve the desired resistance.

eFuse Implementation

The eFuse for a conventional programmable device application is normally configured as a linear array or two dimensional array containing sometimes hundreds of efuses and supporting logic. Several definitions will be helpful in clarifying the descriptions of eFuse implementation to follow.

1. The 'eFuse' itself is a circuit element, which has a natural un-programmed state, but may be permanently programmed to the opposite state.
2. An 'eFuse element' is comprised of an eFuse along with its programming and sensing circuits.
3. An 'eFuse cell' is comprised of an eFuse element plus the local logic required to integrate it into an eFuse array.
4. An 'eFuse array' is a collection of one or more eFuse cells connected in series or arrays. An eFuse controller is comprised of the control logic designed to access the eFuse arrays.
5. An un-programmed eFuse is defined as having a pre-defined maximum 'low' resistance value.
6. A programmed eFuse is defined as having a pre-defined minimum 'high' resistance value.

The eFuse array is programmed by loading the desired 'fused state' and 'non-fused state' locations into a 'programming database' containing a record for the individual elements of the entire array. Then programming those values into each eFuse sequentially can commence.

Because several pulses may be required to successfully blow eFuses, a normal approach is to experiment with applying the eFuse programming data set to program the desired eFuses in a array multiple times to attempt to increase the yield. Due to the physical properties of the fuse body four possible results are observed, two desirable and two undesirable.

Desired Result Possibilities
1. The eFuse was not desired to be programmed and it stayed low resistance after completion of the programming process.
2. The eFuse blew to an acceptable high value of resistance after the pulses were applied.

Undesired Result Possibilities
3. The eFuse blew to an acceptably high resistance after some of the pulses, but degraded after the completion of all of the pulses, and the resistance had become lower than acceptable.
4. The eFuse never blew to an acceptably high resistance, and caused the programming process to incur yield loss.

Case 3 above represents a most significant problem area, which can be mitigated by a special programming algorithm, the focus of this invention. Putting a high enough electrical field across a blown eFuse can cause it to heat the body enough to allow the material to re-melt and grow back creating an unacceptably lower resistance. Good eFuses can in this manner become bad after successive programming pulses. The focus of this invention is a solution to the problem of fuses growing back into an un-fused condition.

FIG. 1 illustrates the conventional eFuse cell circuit configuration, which is comprised of an eFuse element 101 plus the local logic required to integrate it into an eFuse array. This logic includes a CData flip-flop 103 that is clocked by the Enable Clock 108 and stores cell data in the array and a PData flip-flop 102 that is clocked by the Data Clock 106 and latches program data being passed into the eFuse cell.

In the 'program' mode, incoming PData In 107 is latched into the PData flip-flop 102 and programmed into the eFuse element on the occurrence of one or more program pulses initiated at Program input 110. PData passes to the eFuse cell via path 115. In the 'program' mode also, PData Out is passed through multiplexers 104 and 105 and is latched into the CData flip-flop 102. VPP 109 is the input for the programming power source. Program data is passed serially to the next cell in the array at PData Out line 115.

In the 'test' mode, the CData flip-flop latches the data from the present cell and passes it to Cell Data Out 116. This data from he present cell is passed through multiplexer 104 and multiplexer 105 as directed by the Test input 111.

Initz input 112 acts to initialize all flip-flops in the cell array prior to the programming cycle. Margin input 114 allows adjustment to the reference input for a differential amplifier so that the desired 'high' resistance values for a program element may be modified.

FIG. 2 illustrates a simplified view of a conventional eFuse system having an eFuse controller 200, a number of series-connected eFuse cells represented at the input and output ends of the array by 201 and 210 Each cell 201 and 210 have the local logic of FIG. 1 for integrating the cells into an eFuse array. At the last stage of the array 210 PData Out 208 and CData Out 209 are passed back to the controller as required in the 'program' and 'test' modes.

SUMMARY OF THE INVENTION

This invention describes a means for preventing the opportunity for eFuses to become lower resistance due to successive programming pulses after being successfully blown by an earlier set of programming pulses. The solution is achieved through the use of an adaptive programming algorithm for blowing the eFuses. In the adaptive algorithm once a high enough resistance on a blown eFuse has been attained it will not receive additional programming pulses that could cause it to become lower resistance.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
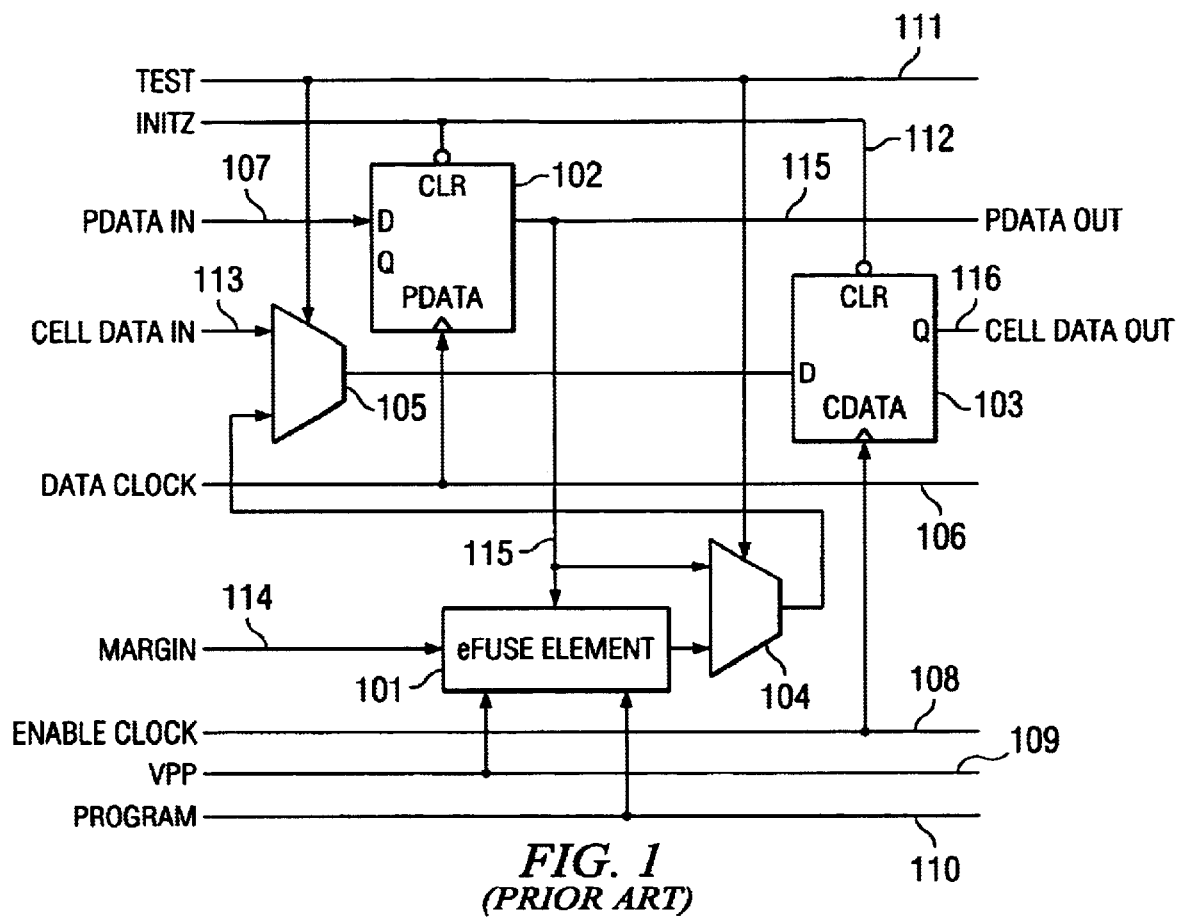
FIG. 1 illustrates the conventional eFuse cell circuit configuration, which is comprised of an eFuse element plus the local logic required to integrate it into an eFuse array (Prior Art)
Figure 2:
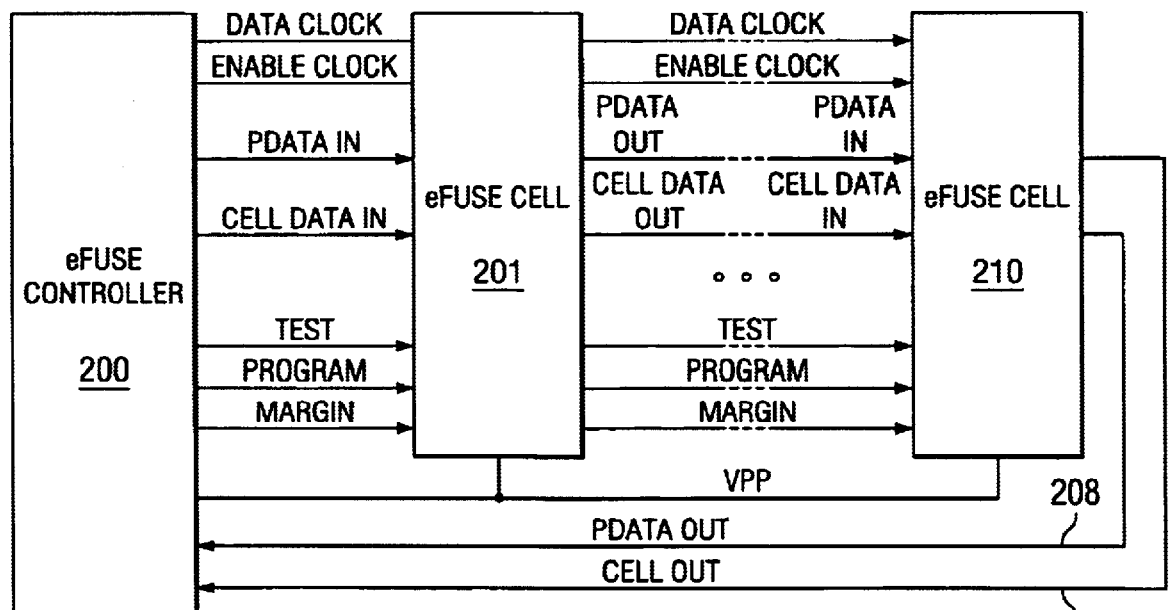
FIG. 2 illustrates a simple conventional eFuse system having an effuse controller and a number of series-connected eFuse cells integrated into an eFuse array (Prior Art)
Figure 3:
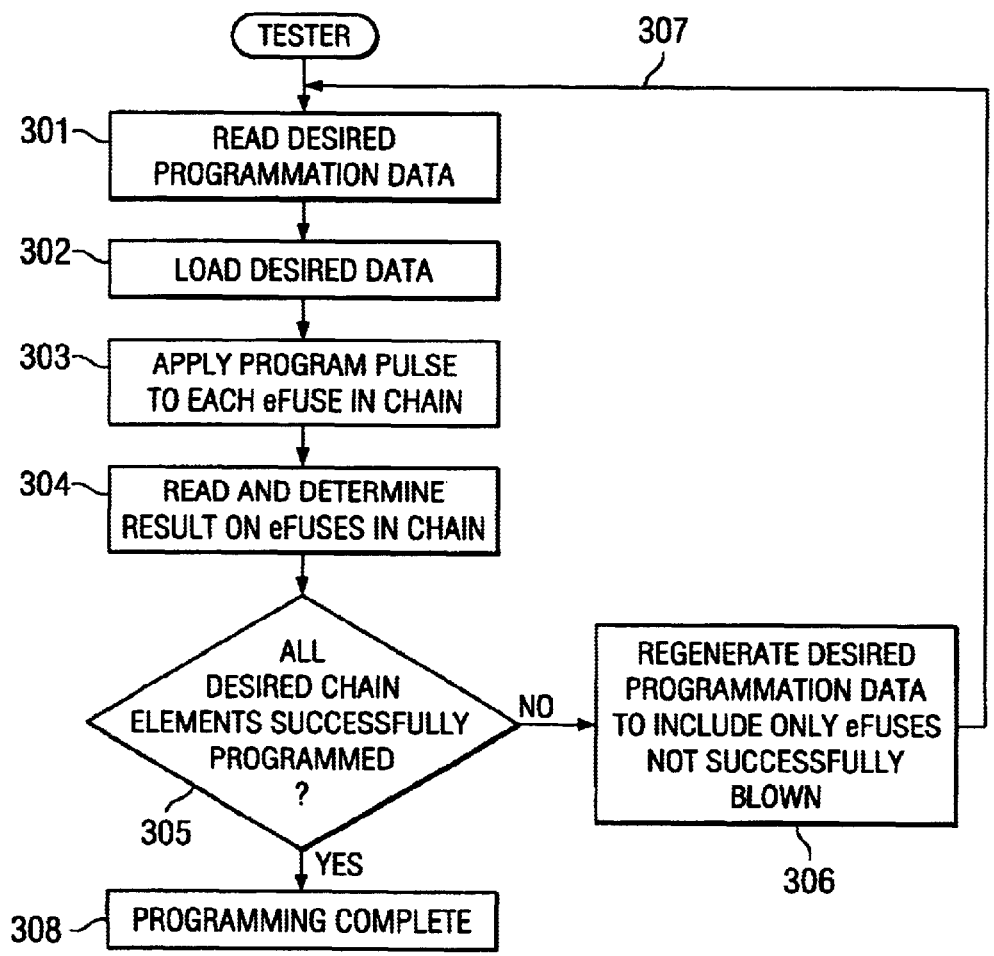
FIG. 3 illustrates the flow chart for the adaptive algorithm eFuse programming method described in this invention.

The solution to preventing eFuses from growing back by the time the complete set of pulses had been applied was solved by developing an adaptive programming algorithm for blowing the eFuses. The adaptive algorithm works as illustrated in the flow chart of FIG. 3. Also a description of the individual process steps follows with references to FIG. 3.

Main Sequence
  1. Determine the data to be programmed into the eFuse array. Read desired programming data into database. [301]
  2. Load the array with the desired data [302] and apply a program pulse to the appropriate eFuses desired to be blown [303]
  3. Read and determine the result on the eFuses, which should have been blown [304].

Adaptive Loop
  4. Perform overall test [305] on array elements and proceed to programming complete [308] {Yes, results are correct} or proceed return loop [306] {No, results are not correct}.
  5. Regenerate the data [306] to include only eFuses which were supposed to be blown, but which did not successfully blow (this is the adaptive part of the routine). Successfully blown fuses are assigned a '0' input on the next pass, just as the 'don't-blow' cells.
  6. Reapply the 'load desired data' 302 and 'apply programming pulse' 303 sequence for a prescribed number of times until desired array results are attained In the adaptive algorithm of FIG. 3, once a high enough resistance on a blown eFuse has been attained it will not receive another programming pulse, which could cause it to degrade from the 'high resistance' state and become a measurably lower resistance link. This adaptive algorithm has allowed programming yields on eFuse arrays to be maximized.

Table 1 illustrates an example of the adaptive eFuse programmation algorithm for a sixteen-element eFuse array. Row 1 of the table shows that the initial values for all eFuses in the array are in a virgin state before programming and thus are all zeros. Row 2 (which matches the desired programmation in Row 8) shows programmation data desired which will be attempted in full on the first pass. A '1' loaded at a given position blows that eFuse. Row 3 shows the results read after the first pass. Four eFuses of the eFuses targeted by a '1' did not blow. Row 4 the programmation data for the second pass, modified to blow only those four eFuses not successfully blown on the first pass. Row 5 shows the results read after the second pass. Two eFuses of those targeted by a '1' in the second pass did not blow. Row 6 shows the programmation data for the third pass, modified to blow only those two eFuses not successfully blown on the second pass. Row 7 shows the results read after the third pass. All eFuses of those targeted by a '1' in the original programmation data are now blown. Thus the programmation data for each pass and the results on the state of the eFuse array after each pass is shown in successive pairs of rows in the table. The desired state, successfully achieved on the third pass, is shown on row 8 at the bottom of the table.

TABLE 1

| eFuse Array State | Read Values of Each eFuse in the Array Programmation Data | | | | | | | | | | | | | | | |
|---|---|---|---|---|---|---|---|---|---|---|---|---|---|---|---|---|
| Read Initial Values | 0 | 0 | 0 | 0 | 0 | 0 | 0 | 0 | 0 | 0 | 0 | 0 | 0 | 0 | 0 | 0 |
| Fuse blow data (first pass) | 0 | 0 | 1 | 1 | 0 | 1 | 0 | 1 | 1 | 1 | 1 | 0 | 1 | 1 | 1 | 0 |
| Read eFuse array (first pass) | 0 | 0 | 1 | 0 | 0 | 1 | 0 | 0 | 1 | 1 | 0 | 0 | 0 | 1 | 1 | 0 |
| Fuse blow data (second pass) | 0 | 0 | 0 | 1 | 0 | 0 | 0 | 1 | 0 | 0 | 1 | 0 | 1 | 0 | 0 | 0 |
| Read eFuse array (second pass) | 0 | 0 | 1 | 0 | 0 | 1 | 0 | 1 | 1 | 1 | 0 | 0 | 1 | 1 | 1 | 0 |
| Fuse blow data | 0 | 0 | 0 | 1 | 0 | 0 | 0 | 0 | 0 | 0 | 1 | 0 | 0 | 0 | 0 | 0 |

TABLE 1-continued

| eFuse Array State | Read Values of Each eFuse in the Array Programmation Data | | | | | | | | | | | | | | | |
|---|---|---|---|---|---|---|---|---|---|---|---|---|---|---|---|---|
| (third pass) | | | | | | | | | | | | | | | | |
| Read eFuse array (third pass) | 0 | 0 | 1 | 1 | 0 | 1 | 0 | 1 | 1 | 1 | 1 | 0 | 1 | 1 | 1 | 0 |
| Desired eFuse array state | 0 | 0 | 1 | 1 | 0 | 1 | 0 | 1 | 1 | 1 | 1 | 0 | 1 | 1 | 1 | 0 |

The advantages of this solution to the programming process may be summarized as follows. The adaptive programming algorithm:

1. Is able to achieve the highest programming yield (percentage of correctly programmed devices);
2. May allow the use of lower voltages for programming, which reduces reliability concerns in the eFuse implementation;
3. May allow the use of lower currents for programming, which reduces the power bus width requirements and results in a Silicon area savings; and
4. May reduce required test time and thereby lowers programming cost.

Future applications for the adaptive programming algorithm include its use in newer technologies as they are introduced. Other possibilities include yield enhancement in advent of the introduction of newer eFuse body composition. The eFuse body is not limited to polysilicon. Programmable contacts or metallization methodologies could also be used and this algorithm would still be applicable. However, efforts to improve eFuse programming yields using new composition approaches may have more and more limitations as voltages continue to decline. The method of this invention is also easily extended to programming of 'anti-fuses', which are high resistance in the un-programmed state and 'low' resistance in the programmed state.

What is claimed is:

1. A method of programming electrical fuses comprising the steps of:
   reading the desired data for a array of fuses to be programmed from a programmation source;
   programming the array of fuses by applying a programmation pulse to fuses where a corresponding bit of the desired data has a first digital state, and applying no programmation pulse to fuses where a corresponding bit in the desired data has a second digital state; and
   repeating the sequence of
      reading the programmation of the fuses,
      programming the array of fuses by applying a programmation pulse to fuses where a corresponding bit of the desired data has a first digital state and the read state of the fuse fails to match the corresponding bit of the desired state, applying no programmation pulse to fuses where a corresponding bit in the desired data has a second digital state, and applying no programmation pulse to fuses where a corresponding bit of the desired data has a first digital state and the read state of the fuse matches the corresponding bit of the desired state,
   until all fuses match the corresponding bit of the desired state.

2. The method of claim 1 wherein:
all electrical fuses initially have a low resistance and some fuses after programmation have a desired state of a high resistance.

3. The method of claim 1 wherein:
all electrical fuses initially have a high resistance and some fuses after programmation have a desired state of a low resistance.

4. The method of claim 1 wherein:
said step of programming the array of fuses includes arranging input programmation data where data bits representing fuses in desired state have a second digital state and data bits representing fuses not in the desired state have a first digital state, and applying a programming pulse only to fuses having data of the first digital state and no programming pulse to fuses having the second digital state.

* * * * *